United States Patent
Matsumoto et al.

(10) Patent No.: US 7,010,283 B2
(45) Date of Patent: Mar. 7, 2006

(54) SIGNAL WAVEFORM DETECTION CIRCUIT

(75) Inventors: Shuichi Matsumoto, Chiba (JP); Akira Yoshida, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 386 days.

(21) Appl. No.: 10/341,405

(22) Filed: Jan. 14, 2003

(65) Prior Publication Data

US 2003/0134608 A1 Jul. 17, 2003

Related U.S. Application Data

(60) Provisional application No. 60/348,377, filed on Jan. 16, 2002.

(51) Int. Cl.
  *H04B 17/00* (2006.01)
  *G06G 7/24* (2006.01)
  *G06F 19/00* (2006.01)

(52) U.S. Cl. .................. 455/226.1; 455/226.2; 455/334; 455/308; 327/350; 327/351; 375/340; 702/70

(58) Field of Classification Search .. 455/226.1–226.4, 455/334, 341, 308, 67.11, 423, 425, 232.1, 455/245.2, 246.1, 250.1; 327/350, 351, 352; 375/316, 318, 340; 330/310; 702/57, 70
See application file for complete search history.

(56) References Cited

U.S. PATENT DOCUMENTS

| | | | | |
|---|---|---|---|---|
| 3,668,535 A | * | 6/1972 | Lansdowne | ................ 329/364 |
| 4,247,949 A | * | 1/1981 | Watanabe et al. | ........ 455/226.2 |
| 4,442,549 A | | 4/1984 | Main | |
| 5,298,811 A | * | 3/1994 | Gilbert | ................... 327/351 |
| 5,489,868 A | * | 2/1996 | Gilbert | ................... 327/351 |
| 5,506,537 A | * | 4/1996 | Kimura | .................. 327/351 |
| 5,689,814 A | * | 11/1997 | Hagisawa et al. | ............ 455/69 |
| 6,311,049 B1 | * | 10/2001 | Yoshizawa | ............... 455/250.1 |
| 6,731,918 B1 | * | 5/2004 | Kaneki | .................... 455/226.1 |

FOREIGN PATENT DOCUMENTS

JP    4-25733    5/1992

* cited by examiner

*Primary Examiner*—Duc M. Nguyen
(74) *Attorney, Agent, or Firm*—Volentine Francos & Whitt, PLLC

(57) ABSTRACT

A signal waveform detection circuit includes an amplifier circuit and a comparing circuit. The amplifier circuit has differential amplifiers connected in series. Each of the differential amplifiers has a common connection point. The comparing circuit is connected to the common connection points of the amplifier circuit. The comparing circuit includes comparing units connected to one of the differential amplifiers. Each of the comparing units has a threshold voltage generating circuit for generating signals. Each signal has a threshold voltage that is set between a maximum threshold voltage of a signal output from the corresponding differential amplifier during a maximum amplitude output and a minimum threshold voltage of a signal output from the corresponding differential amplifier during a minimum amplitude output. The comparing unit further has a comparator comparing a voltage at the common connection point with the threshold voltage.

17 Claims, 10 Drawing Sheets

SIGNAL WAVEFORM DETECTION CIRCUIT

CROSS REFERENCE TO RELATED APPLICATION

The present application claims priority under 35 U.S.C. 119(e)(1) to U.S. provisional application Ser. No. 60/348,377 filed on Jan. 16, 2002.

BACKGROUND OF THE INVENTION

The present invention relates to a signal waveform detection circuit utilized in a wireless machine and other receivers, and able to be applied to e.g., a receiver signal strength indicator (RSSI) detection circuit.

There are a wireless machine and other receivers having a detection circuit for detecting a receiver signal strength indicator (an indicator for judging the signal strength of an input signal) signal.

The conventional circuit construction of the receiver having the detection circuit of Japanese Patent Publication No. 25733/1992 is illustrated in FIG. 2 of the present application.

The detection circuit is constructed by an amplifying circuit AMP200 and an amplitude detection circuit 201. The amplifying circuit AMP200 is constructed by connecting N-differential amplifying circuits Amp1 to AmpN in a column.

The amplitude detection circuit 201 has an electric current generating portion as a voltage/current converting circuit for converting a voltage detected from each differential amplifying circuit to an electric current signal, a common node (NODE100) as an adding means for obtaining a sum total electric current provided by adding the electric currents generated by these N-electric current generating portions, a current mirror circuit ($Q_1$, $Q_2$) for obtaining an output electric current of the same magnitude as the sum total electric current obtained as an adding result, and a bias circuit (D1, D2, Q100, R100) for supplying a bias voltage to each portion.

Concretely, the electric current generating portion (Ri4, Ri5, Qi4: i=1, 2, - - - , N) converts electric potentials (input signal amplitude display signals) appearing in common emitters P1 to PN of a transistor pair constructed the differential amplifying circuit Ampi (i=1 to N) to electric currents IP1 to IPN of the magnitudes corresponding to these electric potentials.

All the respective collector terminals of transistors Qi4 (i=1 to N) constructing these electric current generating portions are commonly connected to the common node (NODE100) so that the sum total electric current IPALL is generated. The current mirror circuit returns the sum total electric current IPALL, and outputs this sum total electric current as an output electric current IRSSI.

The reasons for the adoption of the above construction are as follows. Namely, the electric potentials appearing in the common emitters P1 to PN of the differential amplifying circuits Amp1 to AmpN have characteristics vertically changed in accordance with the strength (amplitude) of input signals of differential inputs IN10 and IN11. If the sum total (output electric current IRSSI) of the electric currents reflecting this electric potential change is calculated, the input signal strength can be detected.

In a supplementary explanation for reference, the differential amplifying circuits Amp1 to AmpN perform the amplification of a gain with respect to the input amplitude of each amplifier, but there is a maximum amplitude able to be outputted in each amplifier. Therefore, the phenomenon that the electric potentials of the common emitters P1 to PN are vertically changed in accordance with the input amplitude, is caused with the electric potentials of the common emitters P1 to PN as a maximum when the output signal amplitude of each amplifier has a maximum value.

Further, each output signal amplitude of the differential amplifying circuit can be set to the maximum amplitude in the order of AmpN, - - - , Amp3, Amp2, Amp1 with respect to the signal amplitudes of input terminals IN10 and IN11. Accordingly, if the magnitude of IRSSI is seen, it is possible to judge which of the differential amplifying circuits Amp1 to AmpN has the maximum amplitude output.

The output electric current IRSSI of the amplitude detection circuit shows the strength (amplitude) of a receiving signal of the differential amplifying circuit AMP200. Accordingly, as mentioned above, this output electric current IRSSI is called a receiving signal strength indicator (RSSI) signal.

The RSSI signal is used as a reference for judging whether the signal strength in sending-out of the transmission side should be raised or lowered to judge the signal strength such as the amplitude of a signal inputted to the receiving side, etc. and receive the signal of the signal strength sufficient to be processed on the receiving side.

In this connection, with respect to the IRSSI signal generated in FIG. 2, the IRSSI signal as an analog value is converted to the RSSI signal digitally (high level/low level) expressed. Therefore, it is general to compare the IRSSI signal with a threshold value in an unillustrated comparing circuit, and judge whether the IRSSI signal exceeds the threshold value or not.

FIG. 3 shows an example of the detection circuit constructed by further arranging such a comparing circuit. In the case of the detection circuit of FIG. 3, the amplifying circuit AMP300 of the construction for connecting the N-differential amplifying circuits Amp1 to AmpN in a column outputs an electric current (input signal amplitude display signal) IRSSIOUT flowed to a common connection point of an input differential pair of the differential amplifying circuits Amp1 to AmpN constituting these respective stages as output electric currents IRSSIOUT1 to IRSSIOUTN at the respective stages, and sets its adding value to a sum total electric current IRSSI. An adding circuit 301 functions as a means for calculating this sum total electric current IRSSI. Here, the output electric currents IRSSIOUT1 to IRSSIOUTN correspond to electric current components of the electric potentials P1 to PN of the common emitter of FIG. 2.

The detection circuit executes the comparison of a signal output VRSSI obtained by converting the sum total electric current IRSSI or the electric current value to a voltage and the threshold value by a comparing circuit 302C, and outputs an output signal RSSI when the signal output VRSSI exceeds the threshold value. This RSSI signal is set to a judging result of the receiving signal strength seen from the entire amplifying circuit AMP300. Thus, the RSSI signal is digitally expressed as at the high or low level.

As shown in FIG. 4(A), the threshold value is here set between the IRSSI level (or VRSSI level) when the signal amplitude of a differential input pair IN0 and IN1 of the amplifying circuit AMP300 is a maximum amplitude (e.g., the amplitude of the same magnitude as a power electric potential VDD), i.e., IRSSImax (or VRSSImax), and the IRSSI level (or VRSSI level) when the signal amplitude of the differential input pair IN0 and IN1 is a minimum amplitude, i.e., IRSSImin (or VRSSImin).

As shown in FIG. 4(B), it is also general to set the threshold value every certain interval A from the IRSSI level (or VRSSI level) when the signal amplitude is the minimum amplitude, i.e., IRSSImin (or VRSSImin).

However, in the case of the conventional circuit, after the electric potential of the common emitter of the differential pair in each differential amplifying circuit constructing the amplifying circuit is converted to an electric current, no RSSI signal of the digital signal can be detected unless processing for calculating a sum total of the electric currents by the adding circuit and then further converting the sum total of the electric currents to a voltage and comparing this voltage with the threshold value is performed.

Namely, in the case of the conventional circuit, the voltage/current converting circuit, the adding circuit, current/voltage converting circuit, etc. are required until the RSSI signal of the digital signal is obtained. Therefore, a problem exists in that the circuit scale is inevitably large-sized.

SUMMARY OF THE INVENTION

A signal waveform detection circuit according to the present invention includes an amplifier circuit and a comparing circuit. The amplifier circuit has differential amplifiers connected in series. Each of the differential amplifiers has a common connection point. The comparing circuit is connected to the common connection points of the amplifier circuit. The comparing circuit includes comparing units connected to one of the differential amplifiers. Each of the comparing units has a threshold voltage generating circuit for generating signals. Each signal has a threshold voltage that is set between a maximum threshold voltage of a signal output from the corresponding differential amplifier during a maximum amplitude output and a minimum threshold voltage of a signal output from the corresponding differential amplifier during a minimum amplitude output. The comparing unit further has a comparator connected to the common connection point and the threshold voltage generating circuit. The comparator compares a voltage at the common connection point with the threshold voltage provided by the threshold voltage generating circuit.

DETAILED DESCRIPTION OF THE PREFERRED EMBODIMENTS

The embodiment examples of a signal amplitude detection circuit in the present application invention will next be explained. This detection circuit can be applied irrespective of the construction that the transmission path of a receiving signal is wireless or not (i.e., the detection circuit can be also applied to the case of a wire path) However, the detection circuit is particularly suitably applied to a wireless communication device of a system (closed loop control type) for controlling transmission electric power on the basis of reception sensitivity on the side of a receiver. The use of the detection circuit is not limited to this case, but can be also applied to a case used in another control on the side of a transmitter and a case used in the control with the receiver.

Figure 1:
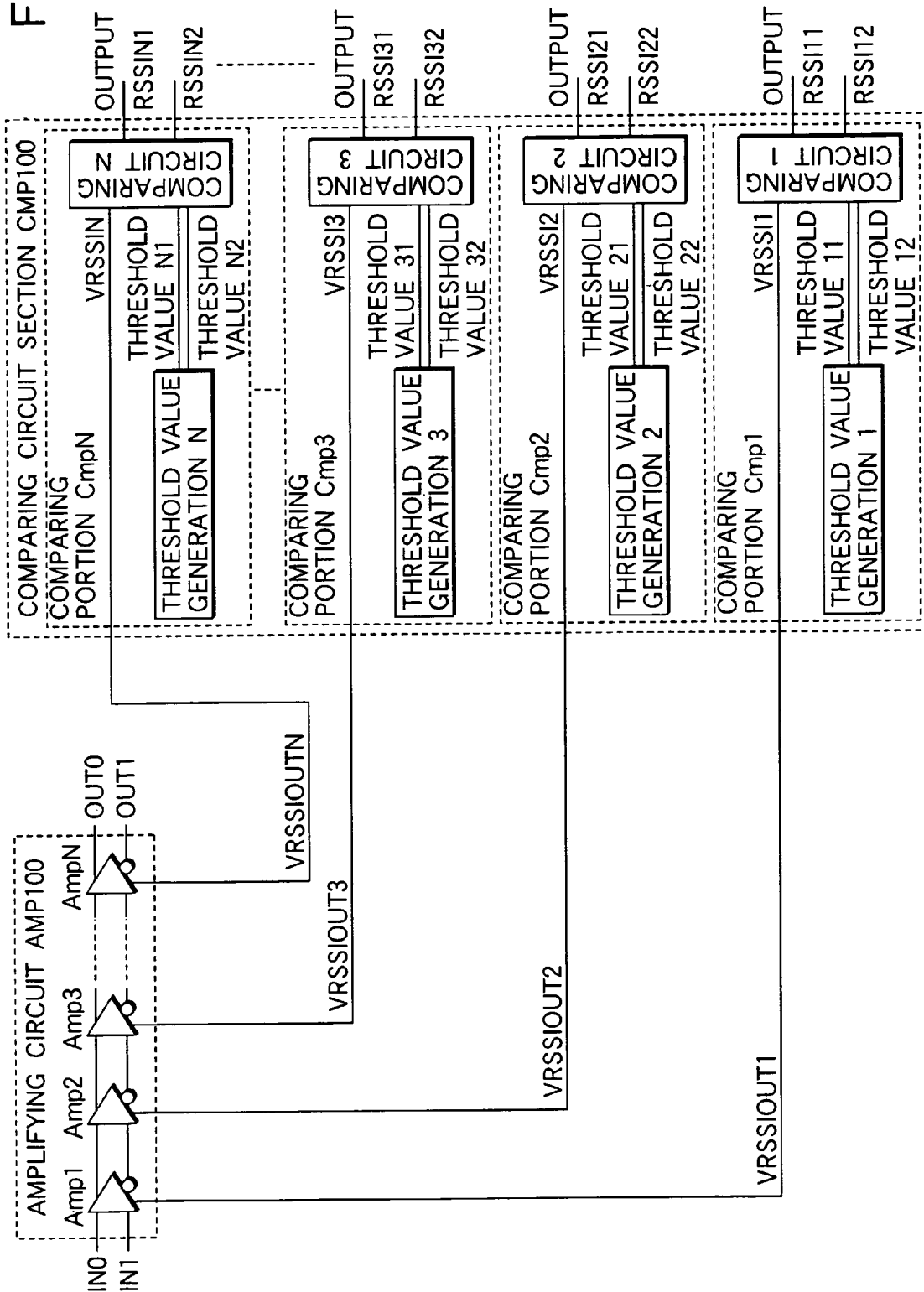
FIG. 1 is a function block diagram showing a first embodiment example.
Figure 2:
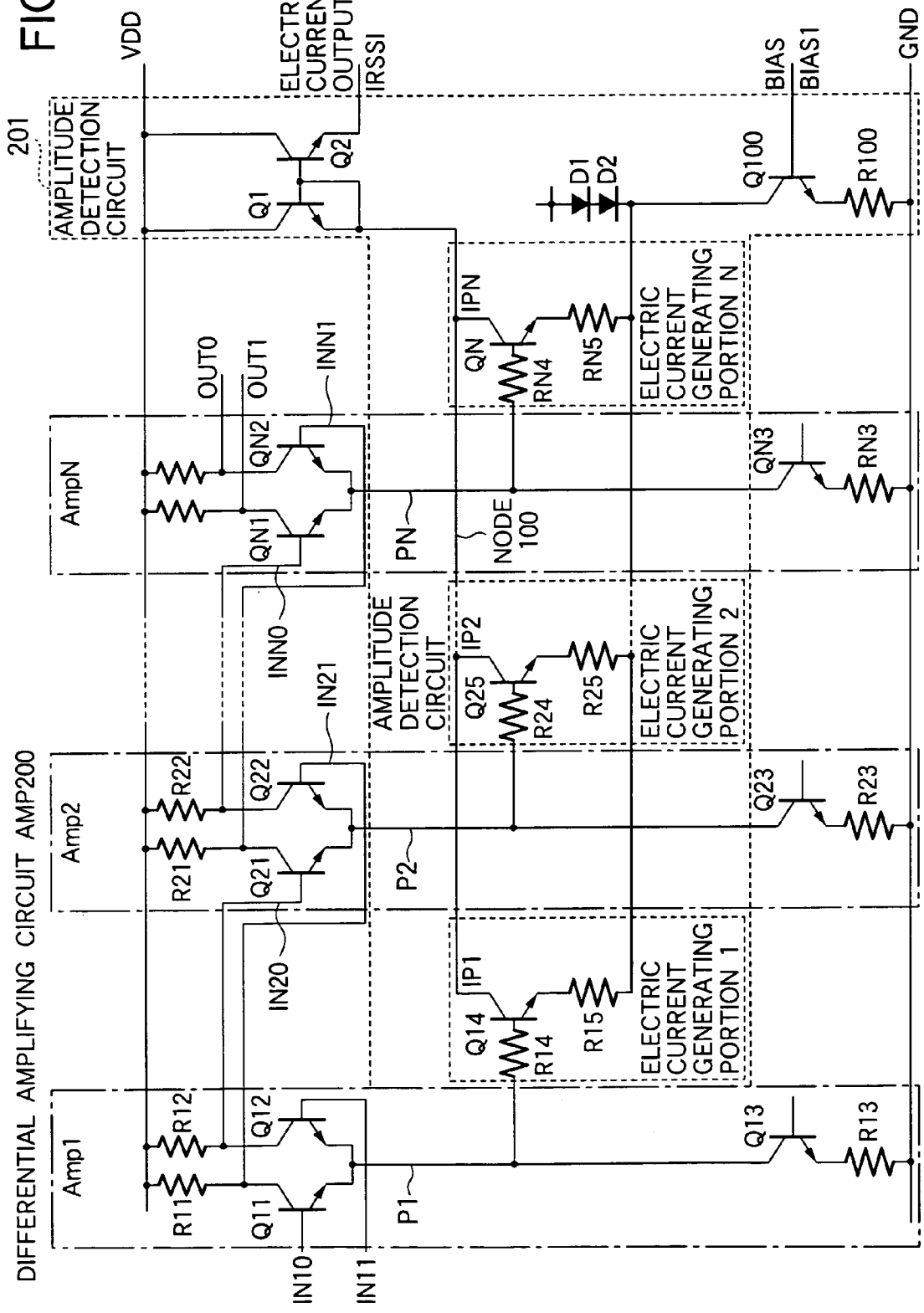
FIG. 2 is a view showing a first example of a conventional construction.
Figure 3:
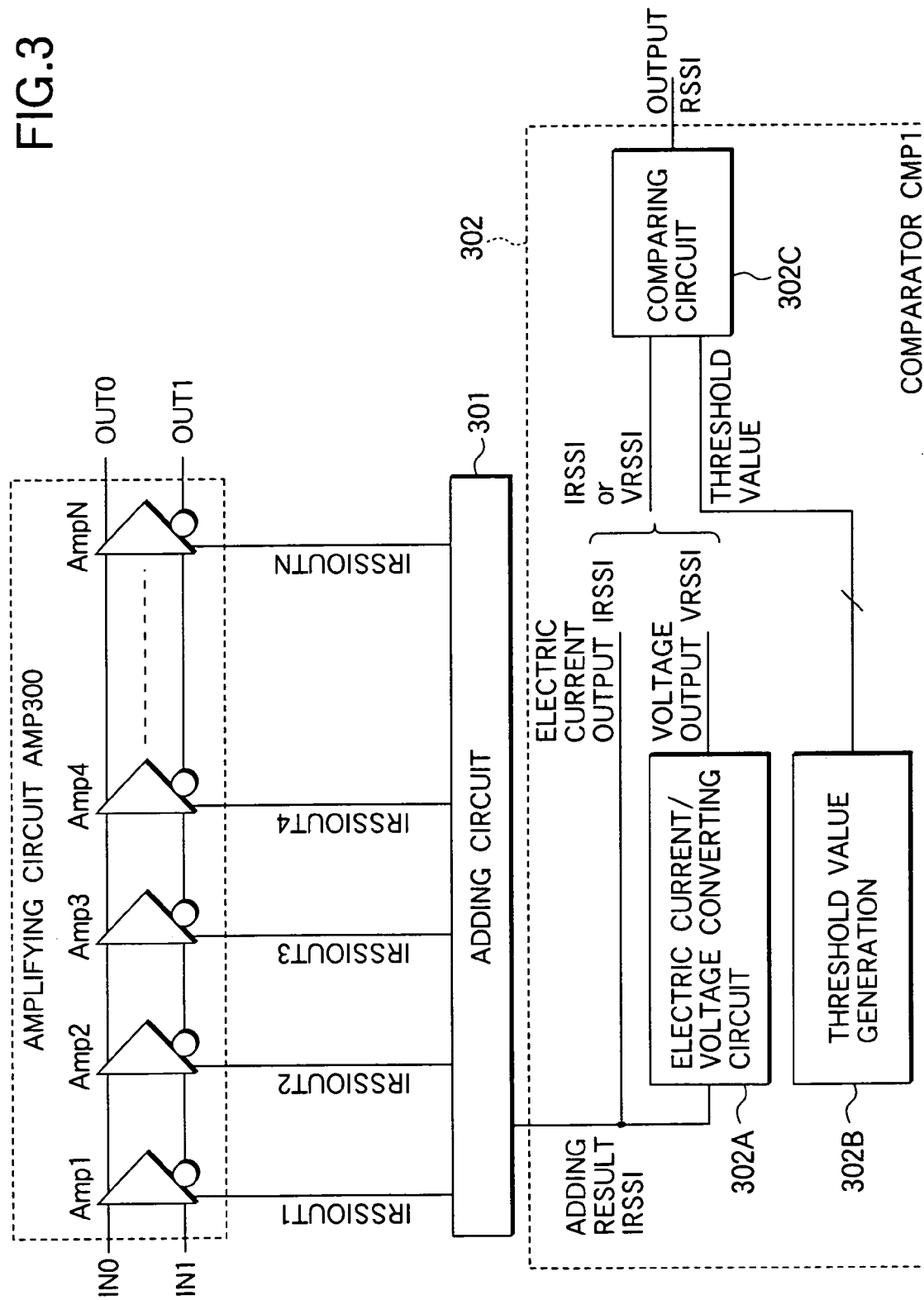
FIG. 3 is a view showing a second example of the conventional construction.
Figure 4:
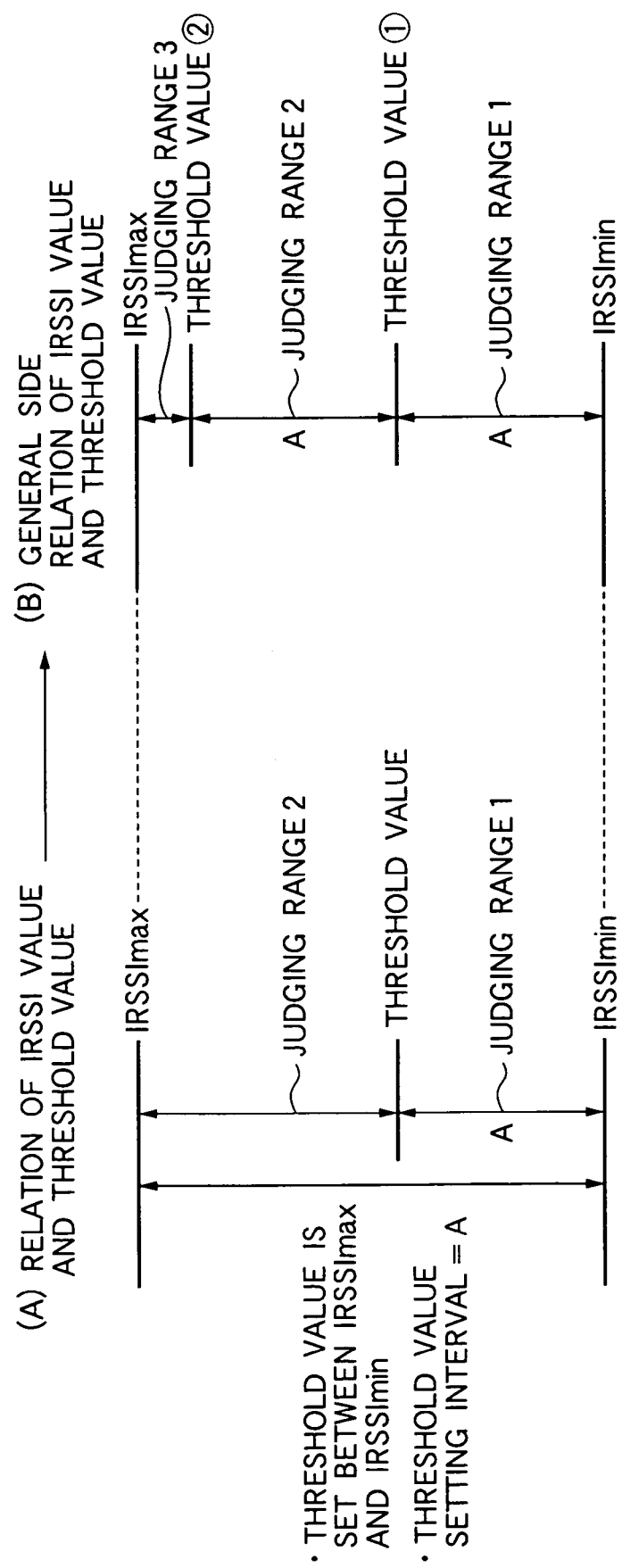
FIG. 4 is a view showing a conventional threshold value setting method.

FIG. 1 shows the function block construction of a signal amplitude detection circuit in accordance with a first embodiment. As shown in FIG. 1, the signal amplitude detection circuit has an amplifying circuit AMP100 constructed by N-differential amplifying circuits Amp1 to AmpN, and a comparing circuit section CMP100.

The detailed construction of the amplifying circuit AMP100 will be described later. The comparing circuit section CMP100 has a construction for individually executing the comparison of voltages VRSSIOUT1 to VRSSIOUTN appearing in a common node of each differential amplifying circuit constituting the amplifying circuit AMP100, and the respective corresponding threshold values.

The comparing circuit section CMP100 has N-comparing portions Cmp1 to CmpN corresponding to the respective differential amplifying circuits constructing the amplifying circuit AMP100. One threshold value generating portion and one comparing circuit are arranged in each comparing portion.

The threshold value generating portion generates M (M is a natural number and is set to two in the case of FIG. 1) threshold values. In this connection, the threshold value is set between maximum and minimum amplitudes able to be adopted in the corresponding differential amplifying circuit. A setting method of the threshold value will be described later.

The comparing circuit is a circuit for comparing the own corresponding input signal amplitude display signal VRSSIOUT and the threshold value generated by the threshold value generating portion, and outputting the large or small relation of each threshold value and the input signal.

Figure 5:
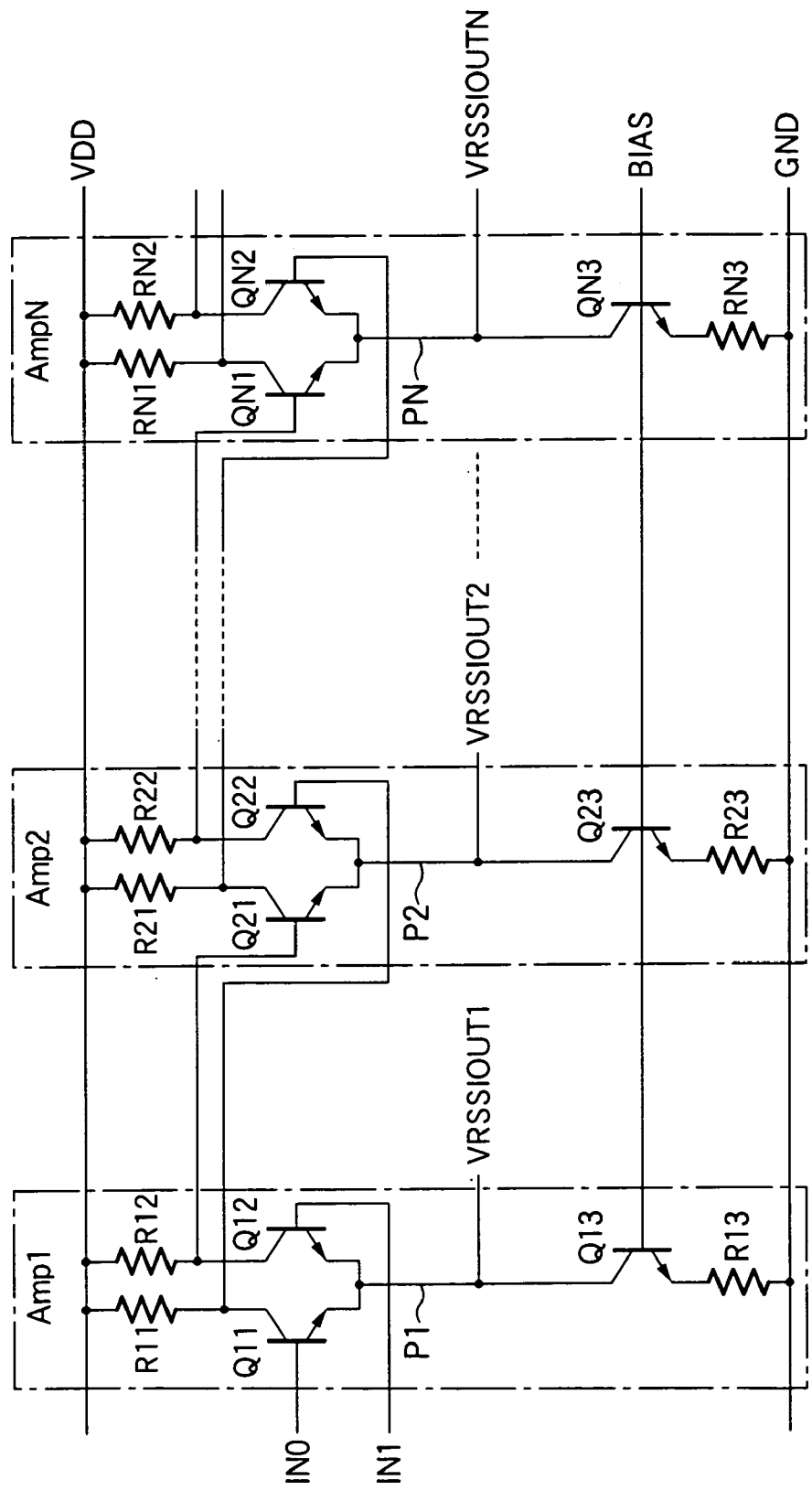
FIG. 5 is a view showing the construction of an amplifying circuit.

FIG. 5 shows a constructional example of the amplifying circuit AMP100. As shown in FIG. 5, this amplifying circuit AMP100 is constructed by connecting N-differential amplifying circuits Amp1 to AmpN in a column. Each of the differential amplifying circuits Amp1 to AmpN is constructed by transistors Qi1 and Qi2 (i=1 to N) constituting a transistor pair, load resistors Ri1 and Ri2 (i=1 to N), a transistor Qi3 (i=1 to N) constituting a constant electric current source, and a resistor Ri3 (i=1 to N).

An electric potential appearing at a common connection point (common emitter portion of FIG. 5) Pi (i=1 to N) of a differential pair of each differential amplifying circuit is outputted as the input signal amplitude display signal VRSSIOUTi (i=1 to N) of each differential amplifying circuit.

The signal waveform detection circuit having such a construction executes the following detecting operation.

Here, each of the differential amplifying circuits Amp1 to AmpN is set to have an amplification degree of α [dB] (=$10^{(\alpha/20)}$ times) to make the explanation.

When the amplitude (the difference between the differential inputs IN0 and IN1) of each input signal of the differential inputs IN0 and IN1 is set to H [V], the amplifying circuit AMP100 amplifies the input amplitude by a step number (i.e., amplifies the input amplitude by α×N [dB]), and outputs a signal of $H \times 10^{(\alpha \cdot N/20)}$ [V] in the amplitude.

At this time, the electric potential appearing at the common connection point (common emitter portion of FIG. 5) of the input differential pair of each amplifier and changed in accordance with the input signal amplitude of each amplifier is outputted as the input signal amplitude display signal from each of the differential amplifying circuits Amp1 to AmpN.

These input signal amplitude display signals are inputted to the comparing circuits 1 to N of the respective corresponding comparing portions Cmp1 to CmpN.

Figure 6:
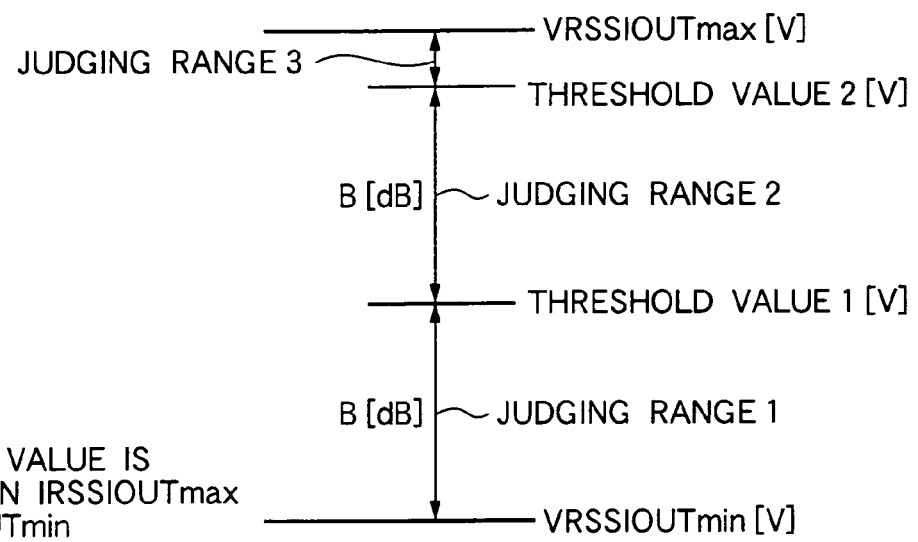
FIG. 6 is a view showing the threshold value setting method in the embodiment.

As shown in FIG. 6, in the threshold value generating portions 1 to N, the threshold value is determined in a state in which the maximum and minimum amplitudes of each of the differential amplifying circuits Amp1 to AmpN outputting the respective corresponding (compared) VRSSIOUT are set to references. Here, the threshold value is set between VRSSIOUTmax when the VRSSIOUT of the corresponding differential amplifying circuit is the maximum amplitude, and VRSSIOUTmin when this VRSSIOUT is the minimum amplitude.

Thus, each output of the differential amplifying circuits Amp1 to AmpN is compared with the individual threshold value in the comparing portions Cmp1 to CmpN within the comparing circuit section CMP100, and its comparing result is outputted as the RSSI signal.

Figure 7:
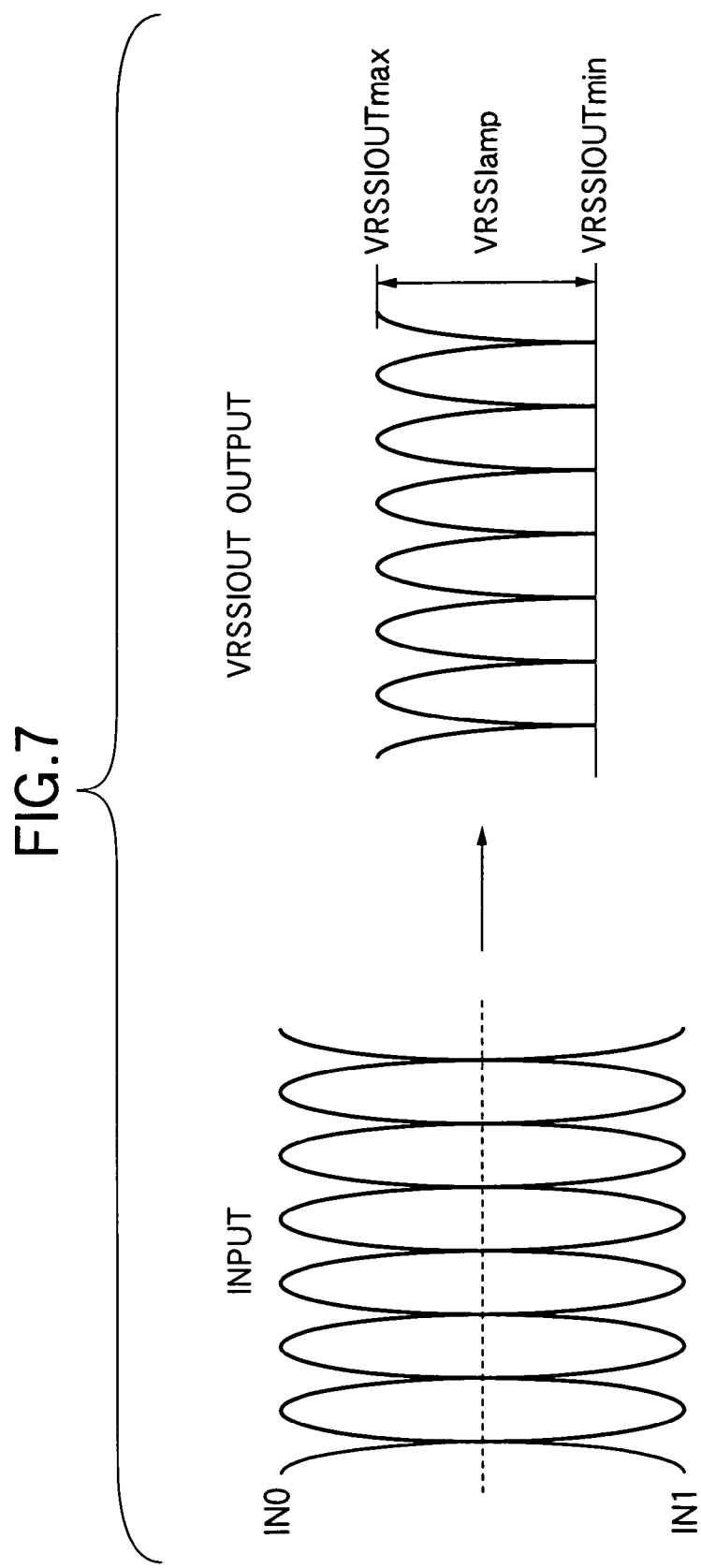
FIG. 7 is a view showing the relation of a balanced input and an output electric potential appearing in a common emitter.

As mentioned above, VRSSIOUT outputted from each differential amplifying circuit is the electric potential appearing in the common emitter portion of the input differential pair, and is therefore formed in a waveform in which the full wave of a balanced input signal is rectified as shown in FIG. 7. Accordingly, the half of the maximum output amplitude of the used amplifying circuit becomes the maximum amplitude of VRSSIOUT.

The threshold value is desirably set as follows when the maximum electric potential at the maximum amplitude time of VRSSIOUT is set to VRSSIOUTmax and the minimum electric potential is set to VRSSIOUTmin, and the amplitude (VRSSIOUTmax−VRSSIOUTmin) at that time is set to VRSSIamp, and the RSSI detecting resolution of an application system is set to B [dB].

In the following explanation, threshold value 1 is set to a smaller value among the threshold values generated by the respective threshold value generating portions, and threshold value 2 is set to a larger value among these threshold values. At this time, the threshold values 1 and 2 are determined as follows.

Threshold value 1=$VRSSI$OUTmin+$VRSSI$amp×$10^{(-B/20)}$ [V]

Threshold value 2=threshold value 1+($VRSSI$OUTmax−threshold value 1)×$10^{(-B/20)}$ [V]

Figure 8:
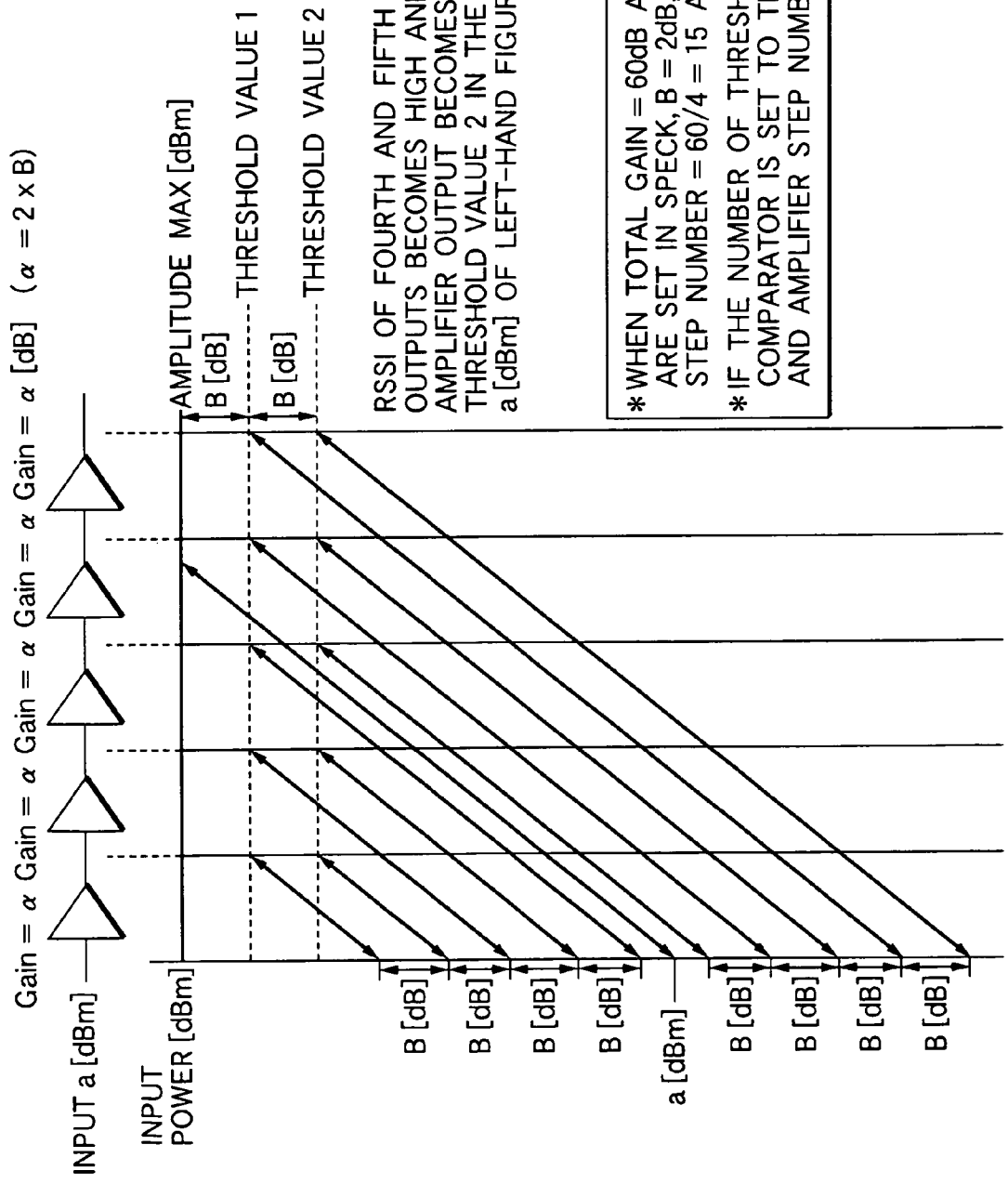
FIG. 8 is a view showing the relation of the output electric potential appearing in the common emitter and the entire threshold value.

If the amplification degree a of the differential amplifying circuit is given by α=2×B, the signal strength can be detected every B [dB] at the input terminal of the amplifier as shown in FIG. 8. In the case of FIG. 8, VRSSIOUT of each of the differential amplifying circuits at fourth and fifth stages becomes the maximum amplitude, and VRSSIOUT of the amplifying circuit at a third stage is detected between the threshold values 1 and 2.

Figure 9:
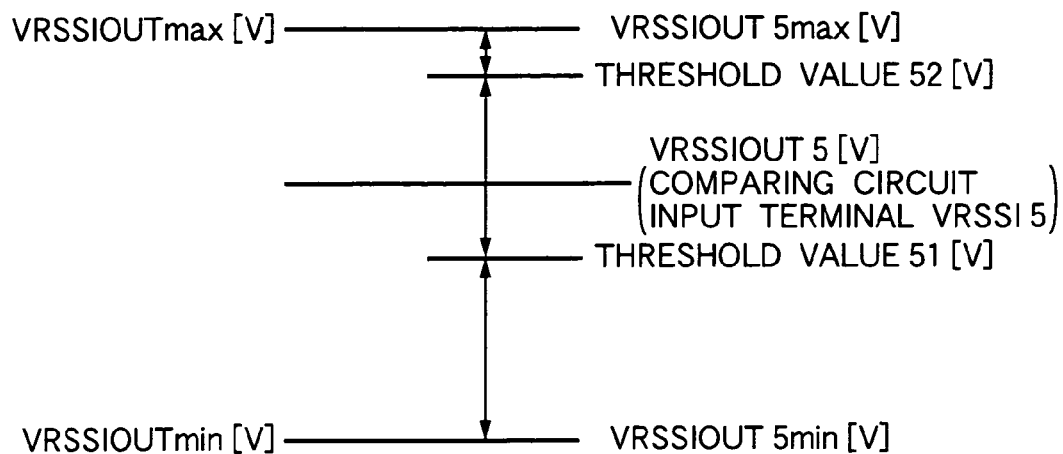
FIG. 9 is a view showing the relation of the output electric potential appearing in the common emitter and the individual threshold value.

One example of the operations of the comparing portions Cmp1 to CmpN will be explained by using FIG. 9. FIG. 9 gives the relation of an input signal amplitude display signal VRSSIOUT5 of the differential amplifying circuit Amp5 located at the fifth stage among the differential amplifying circuits Amp1 to AmpN and threshold values 51, 52 generated by the corresponding threshold value generating portion 5.

In the case of FIG. 9, the input signal amplitude display signal VRSSIOUT5 of the differential amplifying circuit Amp5 is located on the VRSSIOUT5 max side (upper side) from the threshold value 51, and is also located on the VRSSIOUT5 min side (lower side) from the threshold value 52.

Here, the comparing circuit constructing each of the comparing portions Cmp1 to CmpN is set to output the comparing result RSSI signal at the high level when VRSSIOUT5 is located above the threshold value (on the VRSSIOUTmax side). This comparing circuit is also set to output the comparing result RSSI signal at the low level when VRSSIOUT5 is located below the threshold value (on the VRSSIOUTmin side). In this case, the comparing circuit 5 outputs the high level as a comparing result RSSI51 signal of the threshold value 51, and also outputs the low level as a comparing result RSSI52 signal of the threshold value 52.

As mentioned above, in accordance with the first embodiment, the number of circuit elements can be greatly reduced since the signal amplitude can be detected without requiring the voltage/current converting circuit, the adding circuit and the current/voltage converting circuit as in the conventional device. This effect is also obtained when the number of threshold values generated by the threshold value generating portion is one.

Further, the number of steps of the entire amplifying circuit can be reduced by increasing the amplification degree of each stage (differential amplifying circuit) constructing the amplifying circuit, and increasing the number of threshold values generated in the threshold value generating portion within the corresponding comparing circuit section (in this connection, this number is set to two in the above embodiment, but may be also set to three or more). Thus, compactness of the circuit scale can be further realized.

In accordance with the signal waveform detection circuit in this embodiment, the RSSI signal as an output of the comparing circuit section 100 is a binary signal itself. Therefore, it is not necessary to newly prepare an AD converter when such a signal is digitally processed.

A second embodiment as an enlarged construction example of the first embodiment will be subsequently explained.

Figure 10:
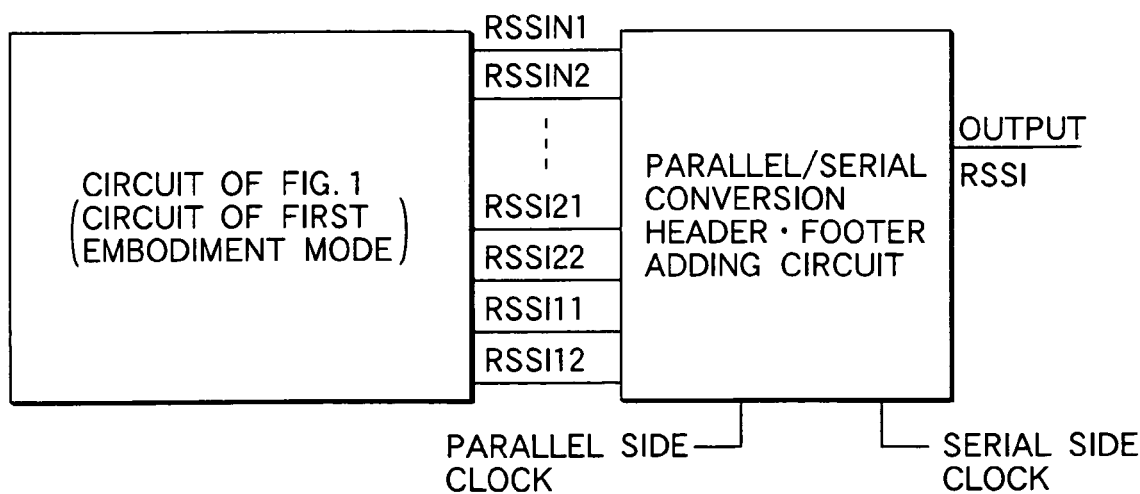
FIG. 10 is a function block diagram showing a second embodiment example.

FIG. 10 shows a function block construction of the signal waveform detection circuit in accordance with the second embodiment. The second embodiment differs from the first embodiment in that a circuit (parallel/serial conversion and header/footer adding circuit) for converting 2×N RSSI signals outputted in parallel from the signal waveform detection circuit explained in the first embodiment to serial outputs is newly arranged.

Here, the parallel/serial conversion and header/footer adding circuit has two function portions. One of the two function portions is a parallel/serial converting function portion for inputting plural RSSI signals and converting these RSSI signals to serial signals. The other of the two function portions is a header/footer signal adding function portion for adding a header signal to the head portion of the RSSI signal and adding a footer signal to the end portion of the RSSI signal when this serial signal is outputted.

The operations of circuit portions explained in the first embodiment have been already explained. Accordingly, only operations proper to this embodiment will be explained here.

For example, when 2×N RSSI signals (RSSI11, RSSI12, - - -, RSSIN1, RSSIN2) are inputted to the parallel/serial converting function portion in timing synchronized with a parallel side clock, the parallel/serial converting function portion converts the arrangement of signals such that these signals are located on the head side in accordance with the former stage of the differential amplifying circuit constituting the amplifying circuit, and a larger threshold value between portions corresponding to the same differential amplifying circuit. In this embodiment example, the parallel/serial converting function portion converts these signals to serial signals with RSSI11 as the head.

For example, when the signal levels of the 2×N RSSI signals are set to RSSI11=0 (low level), RSSI12=0 (low level), RSSI21=0 (low level), RSSI22=1 (high level), RSSI31=1 (high level), RSSI32=1 (high level), - - -, RSSIN1=1 (high level) and RSSIN2=1 (high level), the parallel/serial converting function portion outputs a serial signal constructed by "000111 - - - 11" in an order synchronized with a serial side clock.

In this case, the header/footer signal adding function portion adds the header signal to the head portion of a serial signal output and also adds the footer signal to the end portion of the serial signal output in the conversion to the above serial signal, and outputs the serial signal.

For example, when the header signal is set to "0101" and the footer signal is set to "1111", the above RSSI signal output is converted to "0101000111 - - - 111111", and this RSSI signal is outputted.

Here, when the header signal and the footer signal are set to reference signals for discriminating the RSSI signal (a signal nipped by the header signal and the footer signal is recognized as the RSSI signal), there is 0101 corresponding to the header signal within the serial signal. Thereafter, there are a determined number of signals (the number of signals RSSI11 to RSSIN2). When 1111 corresponding to the footer signal is finally detected, the signal between 0101 and 1111 can be recognized as the contents (RSSI11 to RSSIN2) of the RSSI signal.

In this case, the RSSI signal is detected by detecting the header/footer signal with this as a momentum. Accordingly, the RSSI signal can be sent out in non-synchronization with respect to a circuit for receiving the RSSI signal.

As mentioned above, in accordance with this embodiment, the following effects can be obtained in addition to the effects of the first embodiment.

Namely, in this embodiment, the construction for converting plural RSSI signals to serial signals and sending-out the serial signals is adopted. Therefore, in comparison with the first embodiment, the number of connection wirings with a circuit for receiving the RSSI signals can be reduced (to one RSSI signal wiring).

Further, in the output of this serial signal, this embodiment adopts a mode for adding the header and footer signals to the head portion and the end portion every block of RSSI outputs, and sending-out the serial signal. Therefore, the serial signal can be sent out in non-synchronization with respect to the circuit for receiving the RSSI signal.

Another embodiment example having the signal waveform detection circuit in accordance with each of the above first and second embodiments in one portion of the circuit construction will be subsequently explained.

Figure 11:
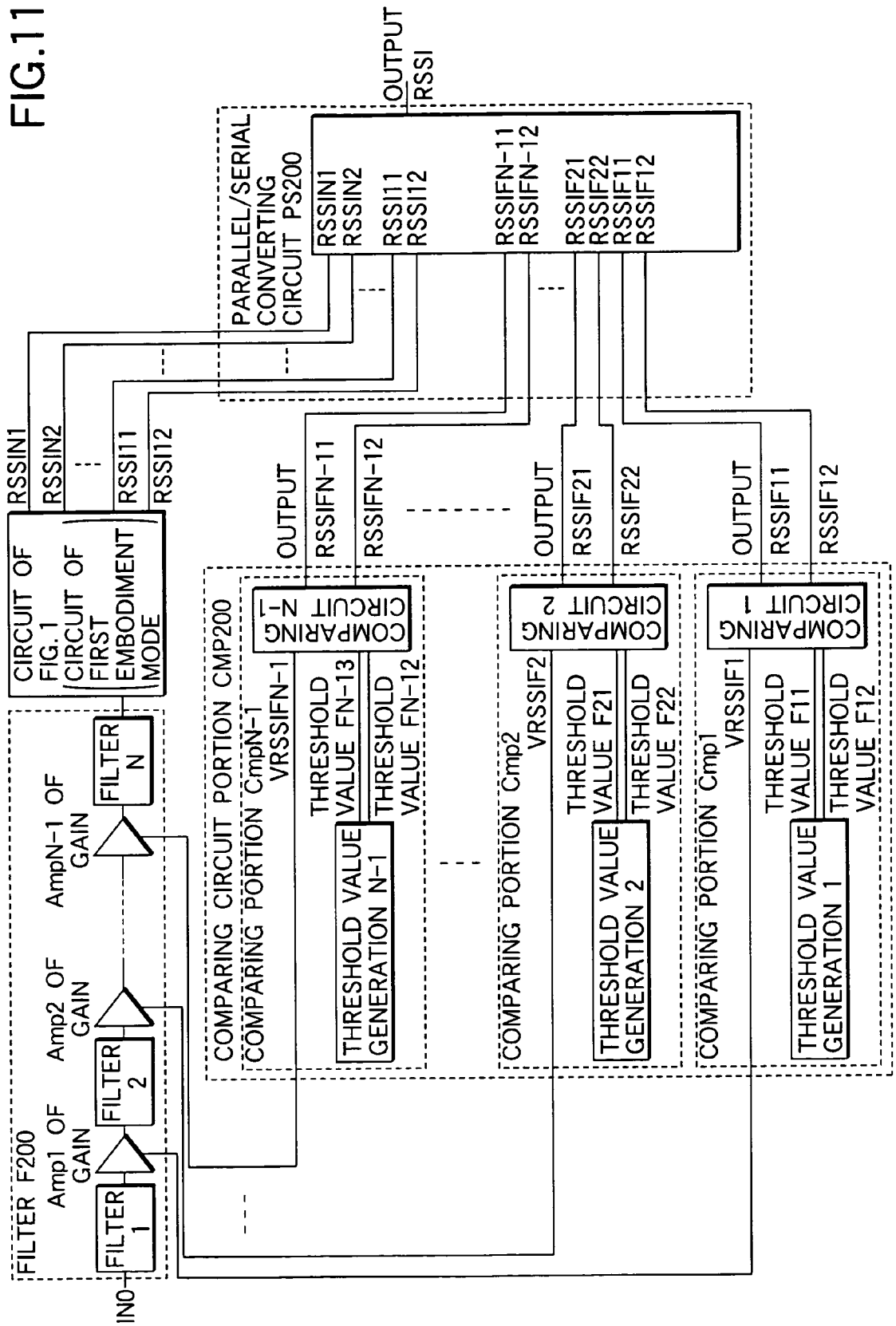
FIG. 11 is a function block diagram showing a third embodiment example.

FIG. 11 shows the function block construction of a signal waveform detection circuit in accordance with a third embodiment. In this third embodiment, when a filter circuit with an amplifying function is arranged at the former stage of the amplifying circuit (constructed by differential amplifying circuits at N-stages) explained in the first embodiment is arranged, it is possible to detect the strength of a signal amplitude at each of an amplifying stage of the filter circuit at the former stage and an amplifying stage of the amplifying circuit at the latter stage.

Namely, the signal waveform detection circuit in accordance with this embodiment has a filter circuit F200, a comparing circuit section CMP200 for detecting the signal amplitude of the amplifying circuit at each stage constituting this filter circuit F200, the circuit construction (FIG. 1) explained in the first embodiment, and a parallel/serial conversion and header/footer adding circuit PS200 for integrating each of a detecting output about the amplifying circuit and a detecting output about the filter circuit with the serial signal.

In FIG. 11, the filter circuit with the amplifying function is set to have the following construction. This construction is one example, and it is not necessary that all the filter circuits with the amplifying function adopt such a construction.

Here, the filter circuit is constructed by the columnar connection of filters 1 to N at N-stages for passing a signal in a predetermined band. Differential amplifying circuits Amp1 to AmpN-1 each having a gain α [dB] are set to be arranged one by one between the respective filters.

The construction of each of the differential amplifying circuits Amp1 to AmpN-1 is the same as the construction of FIG. 5 explained in the first embodiment. Namely, the electric potential appearing at the common connection point of a differential pair is outputted as an input signal amplitude display signal VRSSIOUTi (i=1 to N-1) from the differential amplifying circuits Amp1 to AmpN-1 at these N-1 stages.

The construction of the comparing circuit section CMP200 is the same as the construction of the comparing circuit section CMP100 of the first embodiment. However, the number of comparing portions Cmp is here set to N-1 corresponding to the differential amplifying circuits so as to set the outputs of the differential amplifying circuits at the N-1 stages constituting the filter circuit to detecting objects.

This embodiment is the same as the first embodiment in that one threshold value generating portion and one comparing circuit are arranged in each comparing portion, and the threshold value generating portion generates M (M is a natural number and is set to two in the case of FIG. 11) threshold values, and the comparing circuit outputs the large or small relation of each threshold value and an input signal.

The parallel/serial conversion and header/footer adding circuit PS200 is also the same as the second embodiment in that this parallel/serial conversion and header/footer adding circuit PS200 has two function portions constructed by a parallel/serial converting function portion and a header/footer signal adding function portion.

The parallel/serial conversion and header/footer adding circuit PS200 differs from that in the second embodiment in that the number of input lines of a parallel signal is set to 2×(N-1)+2×N and is therefore large, and the inputted parallel signal is a detecting result with respect to two different circuits.

The header and the footer may be given two sets of headers and footers in total are added) by the header/footer signal adding function portion separately with respect to the detecting result of a signal amplitude obtained from the filter circuit with the amplifying function and the detecting result of a signal amplitude obtained from the amplifying circuit (construction of the first embodiment). Further, only one set of the header and the footer may be also added with respect to the detecting results of two kinds.

Here, the filter circuit F200 is set to have a gain ($\alpha \times (N-1)$) [dB] as a whole. Namely, each of the differential amplifying circuits Amp1 to AmpN-1 is set to have an amplification degree of $\alpha$ [dB] ($=10^{(\alpha(N-1/20)}$ times). Further, each filter stage of the filter circuit F200 is set to have bandpass characteristics, etc. In this connection, all filter stages may not be necessarily unified by the same characteristics.

In this case, the comparing circuit section CMP200 prepared for the filter circuit inputs the electric potential at the common connection point of an input differential pair given from each of the differential amplifying circuits Amp1 to AmpN-1 constituting the filter circuit to the corresponding comparing circuit, and compares this electric potential with each threshold value.

The setting method of the threshold value is the same as the first embodiment. The threshold value is set from VRSSIOUTmin every interval B [dB] between VRSSIOUTmax at the time of a maximum amplitude of each of the differential amplifying circuits Amp1 to AmpN-1 and VRSSIOUTmin at the time of a minimum amplitude.

Accordingly, the RSSI signal output is also obtained from this comparing circuit section CMP200 with respect to each of the differential amplifying circuits constituting the filter circuit F200 with the amplifying function.

Both such 2×(N-1) RSSIF outputs and 2×N RSSIF outputs from the circuit of the first embodiment are converted to serial signals and the header and the footer are added to the serial signals. These serial signals are outputted from the parallel/serial conversion and header/footer adding circuit PS200.

As mentioned above, in accordance with this third embodiment, it is possible to realize the signal waveform detection circuit for reducing an element number and the circuit scale even when plural (here two) amplifying circuit groups as a detecting object exist.

Further, the circuit arrangement (including design and layout) can be set to have the degree of freedom.

In the above first to third embodiments, the number of threshold values given to each comparing circuit is described as two. However, any number of threshold values may be also set if the threshold values are set at an equal interval in the decibel [dB] unit (i.e., logarithmically) between the output VRSSI level when the input signal amplitude of the corresponding amplifying circuit is a maximum amplitude, and the output VRSSI level when the input signal amplitude is a minimum amplitude.

In the above embodiments, it is described that the threshold value is set in a state in which the minimum electric potential appearing at the common connection point of the input differential pair is set to a reference. However, the maximum electric potential may be also set to a reference. Further, an electric potential provided by giving a predetermined offset electric potential to the minimum or maximum electric potential may be also set to the reference electric potential, and the threshold value may be also set logarithmically at the equal interval from this reference electric potential.

Further, similar to the embodiments, the present invention can be also applied to cases in which the order of threshold value signals in the above embodiments is changed and coding is performed.

In the above first to third embodiments, the construction of the amplifying circuit is described by using a bipolar transistor. However, the present invention can be similarly applied to another structure, e.g., a case using a transistor element of another structure such as CMOS, MES, etc.

In the first and second embodiments, the explanation has been made by setting the detecting object of the signal amplitude to the amplifying circuit constructed by the N-differential amplifying circuits. However, the present invention can be also applied to a case in which the filter circuit with the amplifying function as explained in the third embodiment is set to the detecting object.

In the second and third embodiments, the explanation has been made by adding both the header signal and the footer signal to the RSSI signal output. However, similar effects can be also obtained by adding only one of the header signal and the footer signal to the RSSI signal output.

In the third embodiment, the example for securing the amplification factor by inserting the amplifying circuit between the filters arranged in a column is shown. However, similar effects can be also obtained when the amplification factor is secured by impedance conversion within the filter constructed by transconductance (L) and capacitor (C).

In the third embodiment, the case in which the filter circuit with the amplifying function is located at the former stage and the amplifying circuit of the first embodiment is located at the latter stage, has been described. However, the position relation of the amplifying stages as the detecting object may be reversely set.

As mentioned above, in accordance with the invention according to claim 1, a signal waveform detection circuit for detecting the amplitude of a signal inputted to a circuit constructed by arranging amplifying circuits at plural stages in a column is provided, which comprises threshold value generating means respectively corresponding to said amplifying circuits at the plural stages, and each generating M (M is a natural number) threshold values so as to be included within the range of an electric potential able to appear at a common connection point in an input differential pair of the corresponding amplifying circuit; and plural comparing means respectively corresponding to said amplifying circuits at the plural stages, and each outputting individual comparing results of the electric potential appearing at the common connection point in the input differential pair of the corresponding amplifying circuit, and said M (M is a natural number) threshold values. Accordingly, a voltage/current converting circuit, an electric current adding circuit, and a current/voltage converting circuit as in the conventional circuit are not required so that reductions in circuit elements can be correspondingly realized.

Further, since the threshold value generating means can generate M (M is a natural number) threshold values, the amplification degree of the corresponding amplifying circuit can be increased. Further, if the number of threshold values used to judge the amplitude of an input signal of the amplifying circuit is set to be plural, the number of steps of the amplifying circuit constituting a pertinent circuit can be reduced so that a reduction in circuit scale can be correspondingly realized.

Further, since the output of the signal waveform detection circuit is a digital output (since this output is an aggregation of the comparing results of the comparing means), it is not necessary to newly arrange an analog/digital converting circuit when this output is digitally processed by a subsequent stage circuit. Accordingly, the circuit scale can be made compact.

As mentioned above, in accordance with the invention according to claim 2, the M (M is a natural number) threshold values generated by the threshold value generating means in the invention according to claim 1 are given logarithmically at an equal interval with respect to a reference electric potential according to the corresponding amplifying circuit. Accordingly, it is possible to make a judgment in which the amplifying characteristics of each amplifying circuit are further reflected.

As mentioned above, in accordance with the invention according to claim 3, in the signal waveform detection circuit in the invention according to claim 1 or 2, the circuit constructed by arranging said amplifying circuits at the plural stages in a column is a circuit constructed by arranging filter circuits and the amplifying circuits in a column. Accordingly, the invention according to claim 1 or 2 can be also applied to a circuit having the filter circuit in addition to the amplifying circuit.

As mentioned above, in accordance with the invention according to claim 4, the signal waveform detection circuit in the invention according to claim 1, 2 or 3 further comprises parallel/serial converting means for converting plural comparing outputs outputted from said plural comparing means to serial signals, and adding an identification signal to the head or the end of this signal series and outputting the serial signals. Accordingly, it is possible to realize a reduction in the number of wirings required in the connection to the subsequent stage circuit.

Further, a series of signal lines can be reliably extracted by adding an identification code to the head or the end of the series of signal lines. Further, non-synchronization transfer to the subsequent stage circuit can be realized.

What is claimed is:

1. A signal waveform detection circuit comprising:
   an amplifier circuit including a plurality of differential amplifiers connected in series, each of the differential amplifiers having a common connection point; and
   a comparing circuit connected to the common connection points of the amplifier circuit, the comparing circuit including a plurality of comparing units connected to respective ones of the differential amplifiers, each of the comparing units including
      a threshold voltage generating circuit for generating a plurality of signals each of which has a threshold voltage that is set between a maximum threshold voltage of a signal output from the corresponding differential amplifier during a maximum amplitude output and a minimum threshold voltage of a signal output from the corresponding differential amplifier during a minimum amplitude output, and
      a comparator connected to the common connection point of the corresponding differential amplifier and the threshold voltage generating circuit, the comparator comparing a voltage at the common connection point with the threshold voltage provided by the threshold voltage generating circuit.

2. A signal waveform detection circuit according to claim 1, wherein each of the differential amplifiers has
   a first resistor connected between a power supply source and a first output terminal;
   a second resistor connected between the power supply source and a second output terminal;
   a first transistor having a first terminal connected to the first output terminal, a control terminal connected to a first input terminal and a second terminal connected to the common connection point;
   a second transistor having a first terminal connected to the second output terminal, a control terminal connected to a second input terminal and a second terminal connected to the common connection point;
   a third transistor having a first terminal connected to the common connection point, a control terminal connected to receive a bias signal and a second terminal; and
   a third resistor connected between a second power supply source and the second terminal of the third transistor.

3. A signal waveform detection circuit according to claim 2, wherein the first to third transistors are bipolar transistors, the first terminal is a collector, the control terminal is a base and the second terminal is an emitter.

4. A signal waveform detection circuit according to claim 1, wherein the threshold voltages are given logarithmically at substantial equal interval.

5. A signal waveform detection circuit according to claim 4, wherein the threshold voltage generating circuit provides a first threshold voltage VT1 and a second threshold voltage VT2 as follows:

$$VT1 = VRSSIoutmin + VRSSIamp \times 10^{(-B/20)}$$

$$VT2 = VT1 + (VRSSIoutmax - VT1) \times 10^{(-B/20)}$$

wherein VSSIoutmin is a minimum voltage of the voltage at the common connection point, VSSIoutmax is a maximum voltage of the voltage at the common connection point, VRSSIamp is an amplitude of the voltage at the common connection point and B is a detecting resolution of an application system.

6. A signal waveform detection circuit comprising:
   an amplifier circuit including a plurality of differential amplifiers connected in series, each of the differential amplifiers having a common connection point;
   a comparing circuit connected to the common connection points of the amplifier circuit, the comparing circuit including a plurality of comparing units connected to respective ones of the differential amplifiers, each of the comparing units including
      a threshold voltage generating circuit for generating a plurality of signals each of which has a threshold voltage that is set between a maximum threshold voltage of a signal output from the corresponding differential amplifier during a maximum amplitude output and a minimum threshold voltage of a signal output from the corresponding differential amplifier during a minimum amplitude output, and
      a comparator connected to the common connection point of the corresponding differential amplifier and the threshold voltage generating circuit, the comparator comparing a voltage at the common connection point with the threshold voltage provided by the threshold voltage generating circuit and outputting a comparison signal; and
   a parallel/serial conversion and header/footer adding circuit connected to the comparing circuit, the parallel/serial conversion and header/footer adding circuit converting the comparison signals to a serial signal, adding a header signal to a head portion of the serial signal and adding a footer signal to an end portion of the serial signal.

7. A signal waveform detection circuit according to claim 6, wherein each of the differential amplifiers has
a first resistor connected between a power supply source and a first output terminal;
a second resistor connected between the power supply source and a second output terminal;
a first transistor having a first terminal connected to the first output terminal, a control terminal connected to a first input terminal and a second terminal connected to the common connection point;
a second transistor having a first terminal connected to the second output terminal, a control terminal connected to a second input terminal and a second terminal connected to the common connection point;
a third transistor having a first terminal connected to the common connection point, a control terminal connected to receive a bias signal and a second terminal; and
a third resistor connected between a second power supply source and the second terminal of the third transistor.

8. A signal waveform detection circuit according to claim 7, wherein the first to third transistors are bipolar transistors, the first terminal is a collector, the control terminal is a base and the second terminal is an emitter.

9. A signal waveform detection circuit according to claim 6, wherein the threshold voltages are given logarithmically at substantial equal interval.

10. A signal waveform detection circuit according to claim 9, wherein the threshold voltage generating circuit provides a first threshold voltage VT1 and a second threshold voltage VT2 as follows:

$$VT1 = VRSSIoutmin + VRSSIamp \times 10^{(-B/20)}$$

$$VT2 = VT + (VRSSIoutmax - VT1) \times 10^{(-B/20)}$$

wherein VSSIoutmin is a minimum voltage of the voltage at the common connection point, VSSIoutmax is a maximum voltage of the voltage at the common connection point, VRSSIamp is an amplitude of the voltage at the common connection point and B is a detecting resolution of an application system.

11. A signal waveform detection circuit comprising:
a filter circuit including a plurality of filters, and a plurality of amplifiers each of which is connected between the filters, each of the amplifiers outputting a threshold voltage signal;
a first comparing circuit connected to the amplifiers of the filter circuit, the first comparing circuit including a plurality of first comparing units connected to respective ones of the amplifiers, each of the first comparing units including
a first threshold voltage generating circuit for generating a plurality of first signals each of which has a threshold voltage that is set between a first maximum threshold voltage of a signal output from the corresponding amplifier during a maximum amplitude output and a first minimum threshold voltage of a signal output from the corresponding amplifier during a minimum amplitude output, and
a first comparator connected to the corresponding amplifier and the first threshold voltage generating circuit, the first comparator comparing a voltage of the threshold voltage signal with the threshold voltage provided by the first threshold voltage generating circuit and outputting a first comparison signal;
an amplifier circuit connected to the filter circuit, the amplifier circuit including a plurality of differential amplifiers connected in series, each of the differential amplifiers having a common connection point;
a second comparing circuit connected to the common connection points of the amplifier circuit, the second comparing circuit including a plurality of second comparing units connected to respective ones of the differential amplifiers, each of the second comparing units including
a second threshold voltage generating circuit for generating a plurality of second signals each of which has a threshold voltage that is set between a second maximum threshold voltage of a signal output from the corresponding differential amplifier during a maximum amplitude output and a second minimum threshold voltage of a signal output from the corresponding differential amplifier during a minimum amplitude output, and
a second comparator connected to the common connection point of the corresponding differential amplifier and the second threshold voltage generating circuit, the second comparator comparing a voltage at the common connection point with the second threshold voltage provided by the second threshold voltage generating circuit and outputting a second comparison signal; and
a parallel/serial conversion and header/footer adding circuit connected to the first and second comparing circuits, the parallel/serial conversion and header/footer adding circuit converting the first and second comparison signals to a serial signal and adding a header signal to a head portion of the serial signal and adding a footer signal to an end portion of the serial signal.

12. A signal waveform detection circuit according to claim 11, wherein each of the differential amplifiers has
a first resistor connected between a power supply source and a first output terminal;
a second resistor connected between the power supply source and a second output terminal;
a first transistor having a first terminal connected to the first output terminal, a control terminal connected to a first input terminal and a second terminal connected to the common connection point;
a second transistor having a first terminal connected to the second output terminal, a control terminal connected to a second input terminal and a second terminal connected to the common connection point;
a third transistor having a first terminal connected to the common connection point, a control terminal connected to receive a bias signal and a second terminal; and
a third resistor connected between a second power supply source and the second terminal of the third transistor.

13. A signal waveform detection circuit according to claim 11, wherein each of the amplifiers of the filter circuit has
a first resistor connected between a power supply source and a first output terminal;
a second resistor connected between the power supply source and a second output terminal;
a first transistor having a first terminal connected to the first output terminal, a control terminal connected to a first input terminal and a second terminal connected to a common output terminal for outputting the threshold voltage signal;

a second transistor having a first terminal connected to the second output terminal, a control terminal connected to a second input terminal and a second terminal connected to the common output terminal;

a third transistor having a first terminal connected to the common output terminal, a control terminal connected to receive a bias signal and a second terminal; and a third resistor connected between a second power supply source and the second terminal of the third transistor.

14. A signal waveform detection circuit according to claim 12, wherein the first to third transistors are bipolar transistors, the first terminal is a collector, the control terminal is a base and the second terminal is an emitter.

15. A signal waveform detection circuit according to claim 13, wherein the first to third transistors are bipolar transistors, the first terminal is a collector, the control terminal is a base and the second terminal is an emitter.

16. A signal waveform detection circuit according to claim 11, wherein the threshold voltages are given logarithmically at substantial equal interval.

17. A signal waveform detection circuit according to claim 16, wherein the second threshold voltage generating circuit provides a first threshold voltage VT1 and a second threshold voltage VT2 as follows:

$$VT1 = VRSSIoutmin + VRSSIamp \times 10^{(-B/20)}$$

$$VT2 = VT1 + (VRSSIoutmax - VT1) \times 10^{(-B/20)}$$

wherein VSSIoutmin is a minimum voltage of the voltage at the common connection point, VSSIoutmax is a maximum voltage of the voltage at the common connection point, VRSSIamp is an amplitude of the voltage at the common connection point and B is a detecting resolution of an application system.

* * * * *